United States Patent [19]

Jones et al.

[11] 3,906,388

[45] Sept. 16, 1975

[54] DIRECT-TYPE BINARY FREQUENCY SYNTHESIZER FOR MICROWAVE FREQUENCIES

[75] Inventors: John P. Jones; Ronald C. Stirling, both of Clearwater, Fla.

[73] Assignee: Sperry Rand Corporation, New York, N.Y.

[22] Filed: Jan. 28, 1974

[21] Appl. No.: 437,271

[52] U.S. Cl. .................... 331/39; 331/40

[51] Int. Cl.² .................... H03B 21/02

[58] Field of Search .................... 331/37–40; 328/15, 14

[56] References Cited

UNITED STATES PATENTS

| | | | |
|---|---|---|---|
| 2,934,716 | 4/1960 | Smith | 331/39 |
| 3,125,729 | 3/1964 | Stone, Jr. et al. | 331/39 |
| 3,235,815 | 2/1966 | Keicher | 331/39 |
| 3,372,347 | 3/1968 | Jones et al. | 331/39 |

*Primary Examiner*—Siegfried H. Grimm

*Attorney, Agent, or Firm*—Howard P. Terry; Thomas J. Scott

[57] ABSTRACT

An apparatus including means for providing at least four fixed internal frequency signals having four different values of frequency in which all of said frequencies are coupled into a first processor stage comprised of a single pole double throw switch controlled by a first input bit command signal for selecting either of two of said four frequencies for coupling into a first frequency mixer. A third frequency signal is also coupled into the first frequency mixer which provides a first difference frequency output signal that is coupled into a binary frequency divider. The divider output signal is then coupled along with a fourth frequency signal into a second frequency mixer which produces a second difference frequency output signal that is coupled into a third mixer in an output stage which also includes a second single pole double throw switch controlled by a second input bit command signal for selecting either of the same two of the four frequency signals to also be coupled into the third frequency mixer. The output signal produced by the third mixer is a discrete synthesizer frequency output signal selected from a range of frequency output signals in accordance with the input bit command signal. Additional identical processor stages may be added to provide smaller increments between the selectable discrete synthesizer frequency output signals.

13 Claims, 4 Drawing Figures

DIRECT-TYPE BINARY FREQUENCY SYNTHESIZER FOR MICROWAVE FREQUENCIES

BACKGROUND OF THE INVENTION

1. Field of the Invention

The invention relates to the field of signal generators and particularly to signal generators which provide selectable stable frequency output signals produced by performing arithmetic operations, i.e., addition, subtraction, multiplication and division directly upon frequency signals generated by a frequency standard such as a crystal oscillator. Such signal generators are known as direct-type frequency snythesizers and are distinct from indirect-type frequency synthesizers which employ a phase-lock method of synthesis and comprise a voltage controlled oscillator, a stable frequency reference, a variable divider and a phase detector.

In this latter type of synthesizer, the voltage controlled oscillator generates a desired output frequency in response to an output control signal from the phase detector. The desired output frequency is also coupled through the divider into one input on the phase detector and a reference frequency signal from the stable frequency reference is coupled into a second input on the phase detector which compares the phases of the two signals and produces the output control signal that is fed back to the voltage controlled oscillator. The phase-lock frequency method is too slow to follow a changing input frequency and too complex for a frequency synthesizer of reasonable size, weight and cost.

2. Description of the Prior Art

Direct-type frequency synthesizers employ digital frequency dividers comprised of basic counting elements interconnected to form frequency dividers. Two different types of counting elements are used, namely ring counters and binary counters. Ring counters or modulo-N counters include N counting elements to provide division by N. Binary counters are the most efficient frequency dividers and provide division by $2^N$ with N binary elements. Thus a binary counter always has either the same number of elements or less than the number of elements in a ring counter for an identical division ratio. In the prior art binary counters incorporated in direct-type frequency synthesizers are usually designed to divide by 10 through the addition of appropriate gating. This configuration is commonly known as a decade divider. With the use of integrated circuits decade dividers have an upper frequency limit of approximately 500 MHz.

However, subharmonic oscillators capable of dividing frequencies up to several GHz by a factor of 2 which were originally developed for use as storage elements in digital computer memory circuits may be used as binary dividers in digital frequency synthesizers. A subharmonic oscillator which provides division by a factor of 2 is described by J. Hilbrand and W. R. Bean in an article entitled "Semi-conductor Diodes in Parametric Subharmonic Oscillators," RCA Review, June 1959, pages 229–253. Several practical microwave frequency dividers using parametric diodes and simple microwave techniques are discussed by W. J. Goldwasser in an article entitled "Design Shortcuts For Microwave Frequency Dividers," the Electronic Engineer, May 1970, pages 61–65.

The invention described herein discloses a direct type frequency synthesizer incorporating binary dividers which can be used to synthesize at microwave frequencies in place of decade dividers and require a minimum of only four fixed internal frequencies while changing the output frequency in less than 0.1 microseconds which is at least 200 times faster than the time required by a direct-type frequency synthesizer utilizing decade dividers.

SUMMARY OF THE INVENTION

An apparatus including means for providing at least four internal, synchronized frequency signals $F_1$, $F_2$, $F_3$ and $F_4$. A plurality of serially connected identical processor stages in which each stage comprises the serial combination of a single pole double throw switch, a first RF mixer, a binary divider, and a second RF mixer.

The first frequency signal $F_1$ is coupled to a first input terminal on the switch and the second frequency signal $F_2$ is coupled to the second input terminal on the switch. A source of binary bit command signals is also coupled to each switch and controls the selection of either $F_1$ or $F_2$ to be coupled to a first input terminal on the first mixer of each stage. The third frequency signal $F_3$ is coupled to a second input terminal on the first mixer in the first stage. The first mixer in each stage produces a difference output signal that is coupled to the binary divider which divides the difference signal by 2 and couples the divider frequency signal into a first input terminal on the second mixer in each stage. The fourth frequency signal $F_4$ is coupled to the second input terminal on the second mixer. The difference output signal produced by the second mixer is coupled into a second input terminal on the first mixer in the second stage while the selected frequency from the switch in the second stage is coupled into the first input terminal of the first mixer. The second stage and all subsequent identical stages are identical to the first stage except that the output from the preceding stage is coupled into the second input terminal on the first mixer in the following stage. The output stage is comprised of a single pole double throw switch having its input terminals coupled to two of the synchronized internal frequencies and its output terminal coupled to a first terminal on an output mixer which has its second terminal coupled to the output of the mixer in the preceding stage. The switch in the output stage is also controlled by the binary bit number command signals in the same manner as the switches in all the preceding stages. The difference output signal from the final mixer in the output stage is the desired synthesized frequency output signal.

In a five stage direct-type binary frequency synthesizer the desired output signal may have 64 different values selectable in accordance with the binary bit command signals applied to each of the single pole double throw switches in each stage including the output stage.

The frequency increment between each of the 65 possible values is determined by the frequency values of the four internal frequencies $F_1$, $F_2$, $F_3$ and $F_4$. The number of frequency increments may be increased and the frequency separation between increments decreased by inserting additional stages in series before the first stage while the frequency range may be increased by increasing the frequency difference between the frequency signals coupled into the switches.

Alternatively the number of processor stages may be reduced by increasing the number of synchronized internal frequencies.

DISCLOSURE OF THE PREFERRED EMBODIMENT

Figure 1:
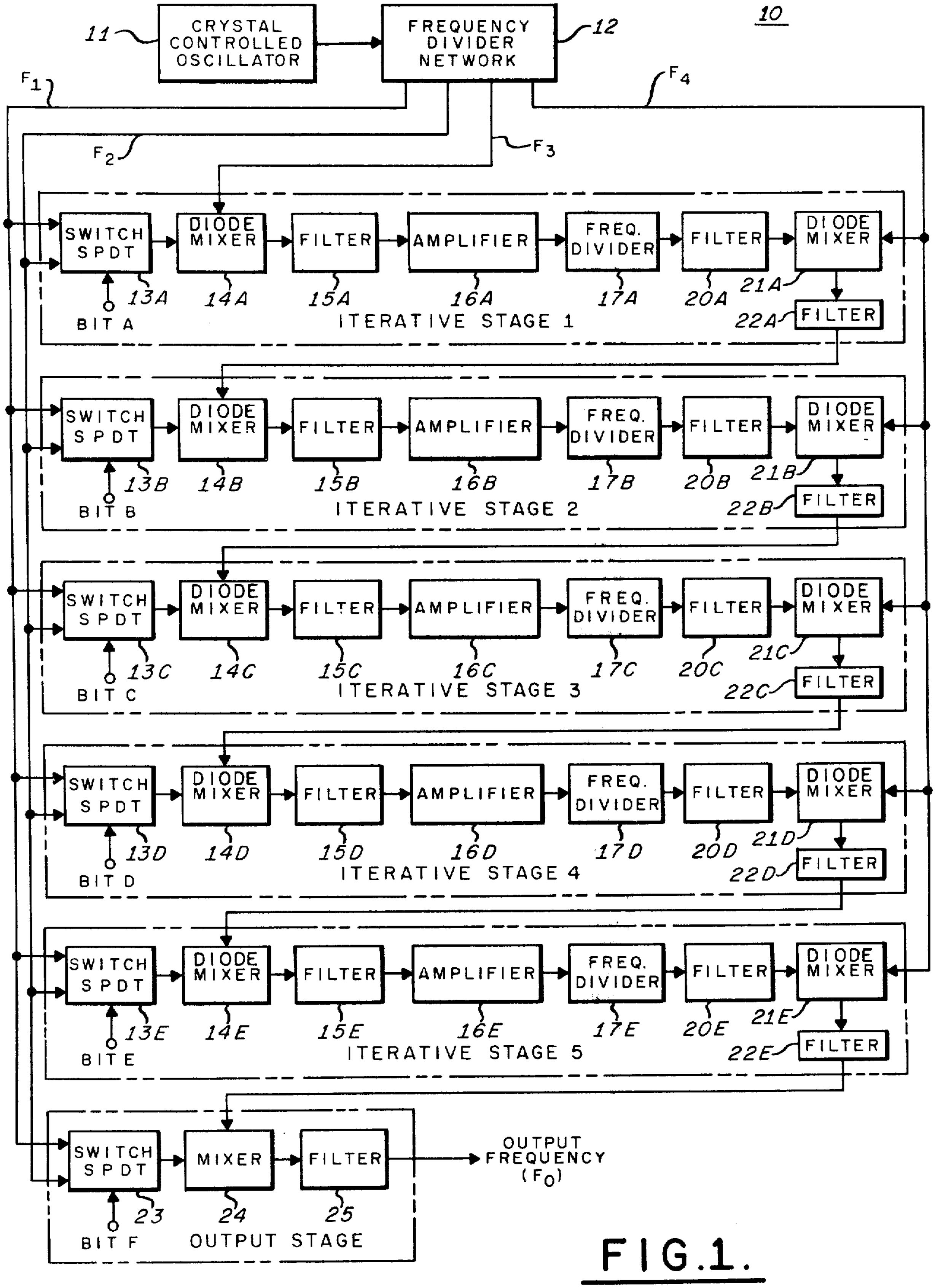
FIG. 1 is a block diagram of a direct type frequency synthesizer incorporating the combination of elements in the subject invention.
Figure 5:
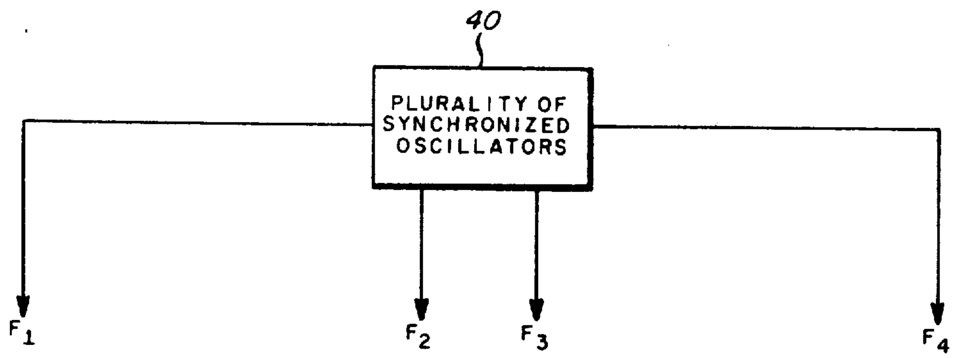
FIG. 5 is a partial block diagram of an alternate embodiment including a plurality of synchronized oscillators in the direct type frequency synthesizer shown in FIG. 1.

As shown in FIG. 1 a direct-type binary frequency synthesizer 10 includes means for providing at least four synchronized internally generated frequencies $F_1$, $F_2$, $F_3$ and $F_4$ which may be produced by a crystal controlled oscillator 11 coupled to an appropriate frequency divider network 12. Alternatively the four synchronized internally generated frequencies $F_1$, $F_2$, $F_3$ and $F_4$ may be produced from a plurality of synchronized oscillators as shown in FIG. 5. Frequencies $F_1$ and $F_2$ are coupled into the single pole double throw switch 13A in iterative processor stage 1. A binary bit command signal, bit A, produced by a source of command signals (not shown) is also coupled into switch 13A to select either the frequency $F_1$ or $F_2$ to be coupled into a first input terminal on a mixer 14A. The second input terminal on the mixer 14A is coupled to the frequency divider network 12 to receive the frequency signal $F_3$. The mixer 14A produces sum and difference output frequency signals proportional to the sum and difference respectively of the frequencies $F_1 \pm F_3$ or $F_2 \pm F_3$ as determined by bit number 1. Since the sum output frequency signal is not utilized it is terminated in an appropriate load means (not shown) in a manner well known in the art.

The difference frequency output signal produced by the mixer 14A is coupled into a band pass filter 15A tuned to the pass band of the range of difference frequencies for the mixer 14A input values. The filtered difference frequency output signal is coupled to the input of an RF amplifier 16A which increases the power level of the difference frequency signal to a value suitable for driving a frequency divider 17A which divides the amplified difference frequency by 2 thereby providing a divided difference frequency signal which is coupled to the input terminal on a second band pass filter 20A. The band pass filter 20A is tuned to the pass band of a range of frequencies which is equal to one half the pass band of the filter 15A. The frequency output signal from the filter 20A is coupled to a first input terminal on a mixer 21A. The second input terminal on the mixer 21A which may be a passive diode mixer is coupled to the frequency divider network 12 to receive the fourth synchronized internal frequency $F_4$. The mixer 21A is identical to the mixer 14A and provides sum and difference output signals having a frequency equal to the sum and difference of the input frequencies. The sum output frequency signal is terminated in an appropriate load (not shown) in a manner well known in the art. The difference output frequency signal is coupled to a band pass filter 22A tuned to the pass band of the range difference output frequencies for the mixer 21A input values. The filtered difference output frequency is coupled into a second input terminal on the first mixer 14B in iterative stage 2. The first input terminal on the mixer 14B is coupled to the output of the single pole double throw switch 13B which has its input terminals coupled to the frequency divider network 12 to receive the frequency signals $F_1$ and $F_2$. Bit B produced by the source of binary bit number command signals selects the desired frequency to be coupled into the input terminal of mixer 14B. The remainder of iterative stage 2 is identical to iterative stage 1 and iterative stages 3, 4 and 5 are identical to iterative stage 2.

The only difference between iterative stages 2, 3, 4 and 5 is that the respective single pole double throw switches 13B, 13C, 13D and 13E are controlled by bits B, C, D and E, respectively.

Iterative stage 5 produces a filtered difference output frequency signal from the filter 22E that is coupled into a second input terminal on a mixer 24 which is identical to the mixers 14A–E and 21A–E. A single pole double throw switch 23 has its output terminal coupled to a first input terminal on the mixer 24 and its input terminals coupled to the frequency divider network 12 to receive the frequencies $F_1$ and $F_2$ respectively. Bit F which is also produced by the source of binary bit command signals is coupled into switch 23 to select either the frequency $F_1$ or the frequency $F_2$ to be coupled into the first input terminal on the mixer 24. The difference output frequency signal produced by the mixer 24 is coupled through a band pass filter 25 which is tuned to the pass band at the range of difference frequencies for the mixer 24 input values. The output frequency $F_0$ provided at the output terminal of the filter 25 is the desired output frequency selected in accordance with the bit number command signal and the specific values of the frequencies $F_1$, $F_2$, $F_3$ and $F_4$.

A specific embodiment of the synthesizer shown in FIG. 1 will be described with reference to the simplified block diagram shown in FIG. 2. The filters 15A–E, 20A–E, 22A–E and 25, amplifiers 16 A–E along with the source of synchronized internal frequencies crystal controlled oscillator 11 and frequency divider network 12, have been omitted to simplify the explanation and presentation of the specific embodiment.

Figure 2:
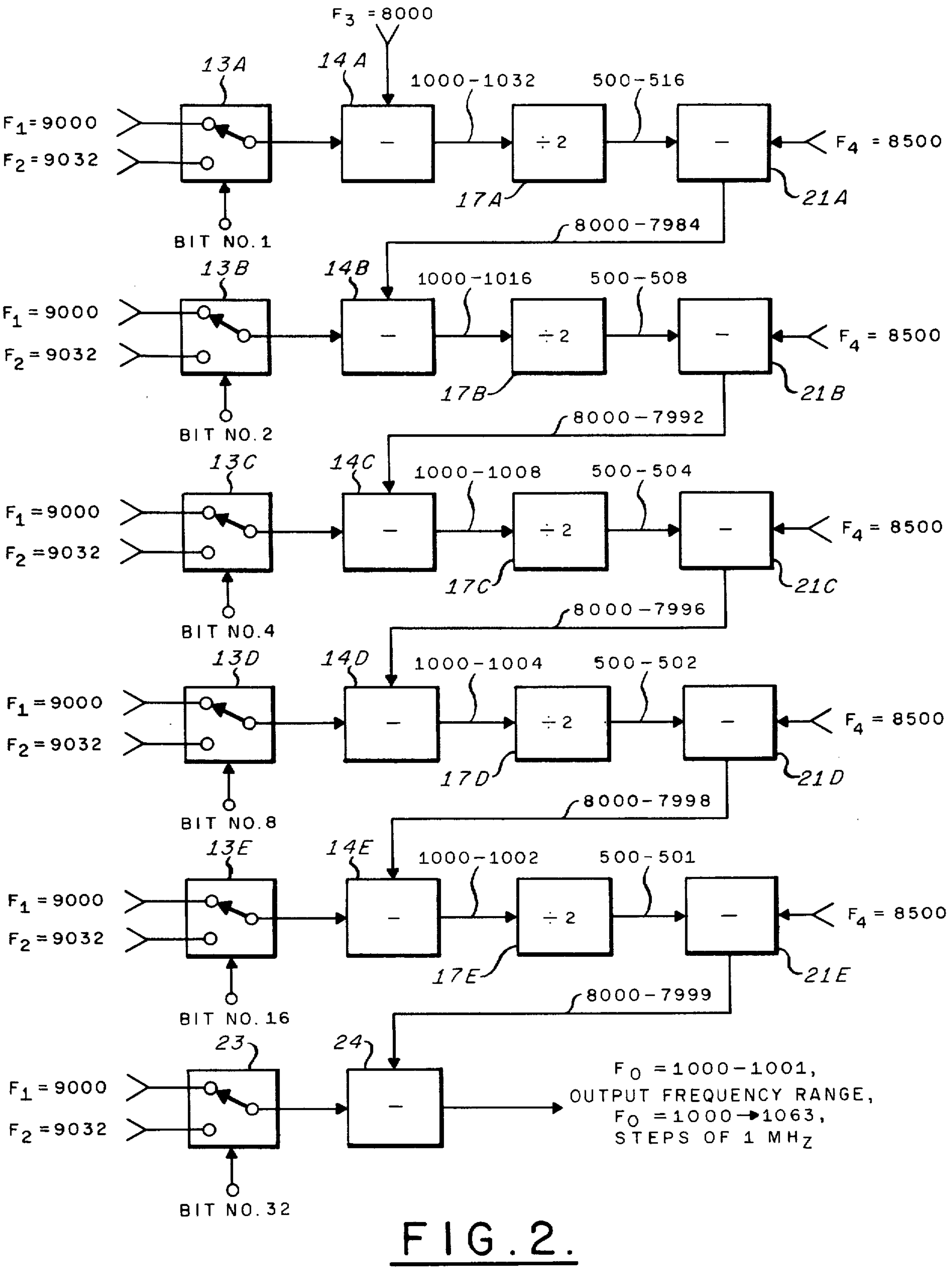
FIG. 2 is a simplified block diagram including typical frequency values used to describe the preferred embodiment.

As shown in FIG. 2 the frequencies $F_1$ and $F_2$ have values of 9,000 MHz and 9,032 MHz respectively which are applied to the single pole double throw switches 13A–E. The binary bit command signals bit number 1, 2, 4, 8 and 16 control the switches 13A–E to select either the frequency 9,000 MHz or 9,032 MHz to be coupled into the first input terminal on the associated mixer 14A–E. Assuming the switches 13A–E have the positions indicated in FIG. 2 when the binary bit command signals are all zeros, then the frequency 9,000 MHz will be coupled into the respective input terminals of the mixers 14A–E.

The specific value of the frequency $F_3$ is shown as 8,000 MHz and is coupled into the second input terminal of the mixer 14A. The difference frequency output produced at the output terminal of the mixer 14A will be equal to the difference between the applied input frequencies, i.e., $F_1$–$F_3$ (9,000 − 8,000 = 1,000 MHz). The difference output frequency is coupled into the binary divider where it is divided by 2 to provide an output frequency having one-half the value of the difference output frequency, i.e., 1,000 ÷ 2 = 500 MHz. The divided difference frequency signal produced by the binary divider 17A is coupled into the first input terminal on the mixer 21A and the fourth frequency signal $F_4$ which has a value equal to 8,500 MHz is coupled into the second input terminal on the mixer 21A. The difference output frequency signal produced by the mixer 21A has a value equal to the difference between the fourth frequency signal and the divided difference frequency signal, i.e., 8,500 − 500 = 8,000 MHz.

This second difference frequency signal produced by the mixer 21A is coupled into the second input terminal on the first mixer 14B in the second processor stage. The RF switch 13B is also coupled to the frequencies $F_1$ and $F_2$, 9,000 and 9,032 $MH_z$ respectively. Assuming bit number 2 is a digital zero and switch 13B is in the position shown in FIG. 2, the frequency $F_1$ is coupled through the switch 13B into the first input terminal on the first mixer 14B. The difference frequency output signal produced by the mixer 14B will be the difference between the difference frequency signal from the second mixer 21A and the frequency $F_1$, i.e., 9,000 − 8,000 = 1,000 MHz. The 1,000 MHz difference frequency signal from the first mixer 14B in the second processor stage is coupled into the binary divider 17B which divides the difference frequency signal by 2 to provide a divided difference frequency output signal having a frequency value of 500 MHz which is coupled into the first input terminal on the second mixer 21B in the second processor stage. The second input terminal on the second mixer 21B also receives the frequency $F_4$ which as a frequency value 8,500 MHz. The difference frequency output signal produced by the second mixer 21B has a value equal to the difference between the frequency signals applied to the first and second input terminals of the mixer 21B, i.e., 8,000 MHz.

Assuming that bit numbers 4, 8, 16 and 32 are the same as bit numbers 1 and 2, the respective RF switches 13C–E and 23 will be in the position shown in FIG. 2 and the frequency $F_1$ will be coupled through each of the switches into the first input terminal on the first mixer 14C–E in each of the third, fourth and fifth processor stages and into the output mixer 24 in the output stage. Since each of the second input terminals on the second mixers 21C–E is coupled to the frequency $F_4$ and each of the dividers 17C–E is a binary divider, the difference output signal coupled into the second input terminal of the first mixer in each of the remaining stages 14C–E and the output mixer 24 in the output stage will have a frequency value of 8,000 MHz. Then the difference frequency output signal from each of the first mixers 14C–E of each stage will have a frequency of 1,000 MHz. Similarly the desired frequency output signal $F_0$ produced by the output mixer 24 in the output stage will have a frequency value of 1,000 MHz.

Assuming each of the bit numbers 2, 4, 8, 16 and 32 remains a binary 0 and only bit number 1 is changed to a binary 1, then the RF switch 13A will couple the frequency $F_2$ into the first mixer 14A while the other RF switches 13B–E and 23 couple the frequency $F_1$ into the first mixer in each stage and the output mixer in the output stage. Thus there will be a 32 MHz change in frequency which will be divided by 2 in each of the five processor stages which will produce a change in the output frequency $F_0$ of 1 MHz since 32/2 = 16; 16/2 = 8; 8/2 = 4; 4/2 = 2 and 2/2 = 1.

The sequence of operation of each stage in the frequency synthesizer shown in FIG. 2 for bit number 1 being a binary 1 and bit numbers 2, 4, 8, 16 and 32 being binary zeros is as follows: the first mixer 14A receives the frequencies $F_2$ = 9,032 MHz and $F_3$ = 8,000 MHz and produces the difference output frequency 1,032 MHz. The first binary divider 17A produces a divided difference frequency having a value 1,032/2 = 516 MHz. The second mixer 21A receives the frequencies $F_4$ = 8,500 MHz and a divider difference frequency 516 MHz and produces a difference output frequency having a value equal to 7,984 MHz. The first mixer in the second stage 14B receives the frequency $F_1$ = 9,000 and the difference frequency from the output of the mixer 21A = 7,984 MHz and produces a difference output frequency having a value 9,000 − 7,984 = 1,016 MHz which is coupled through the binary divider 17B. The divider difference frequency output from the binary divider 17B has a frequency value of 508 MHz which is coupled into the second mixer 21B along with the frequency $F_4$ = 8500 MHz. The difference output frequency produced by the mixer 21B has a frequency value of 8,500 − 508 = 7,992 MHz. The first mixer 14 in the third stage receives the frequency $F_1$ = 9,000 MHz and the difference frequency output signal having a value 7,992 MHz and produces a difference frequency output signal having a value = 1,008 MHz which is divided by 2 in the binary frequency divider 17C to produce the divided difference frequency output having a frequency of 504 MHz.

The second mixer 21C in the third stage receives the frequency $F_4$ = 8,500 MHz and the divided difference frequency 504 MHz and produces a difference frequency output having a frequency value of 7,996 MHz which is coupled into the first mixer 14D in the fourth stage. The frequency $F_1$ is coupled through the switch 13D into the first mixer 14D which produces a difference output frequency having a value equal to the difference between the frequency $F_1$ and the difference output frequency from the mixer 21C, i.e. 9,000 − 7,996 = 1,004 MHz which is divided by 2 in the binary divider 17D to provide an output frequency of 502 MHz. The second frequency mixer 21D in the fourth stage receives the difference frequency 502 MHz and the frequency $F_4$ = 8,500 MHz and produces a difference frequency output signal having a frequency of 7,998 MHz which is coupled into the first mixer 14E in the fifth stage. The frequency $F_1$ is coupled through the switch 13E into the first mixer 14E which produces a difference frequency output having a frequency of 1,002 MHz which is divided by 2 in the binary divider 17E to provide a frequency of 501 MHz. The second mixer 21E in the fifth stage receives the frequency $F_4$ = 8,500 MHz and the divided difference frequency of 501 MHz providing a difference frequency output of 7,999 MHz.

The output mixer 24 receives the frequency $F_1$ = 9,000 MHz through the RF switch 23 and the difference frequency output signal from the mixer 21E having a value 7,999 MHz and produces an output frequency $F_0$ = 1,001 MHz.

It will be appreciated that the binary bit command signals, bit numbers 1, 2, 4, 8, 16 and 32 by controlling the selection of the frequencies $F_1$ and $F_2$ in the RF switches 13A–E and 23 produce 64 different frequency values for the output frequency $F_0$ in the range 1,000–1,063 MHz in steps of 1 MHz in accordance with Table I:

| BIT NUMBER | | | | | | FREQUENCY |
|---|---|---|---|---|---|---|
| 32 | 16 | 8 | 4 | 2 | 1 | |
| 0 | 0 | 0 | 0 | 0 | 0 | 1000 |
| 0 | 0 | 0 | 0 | 0 | 1 | 1001 |
| 0 | 0 | 0 | 0 | 1 | 0 | 1002 |
| 0 | 0 | 0 | 0 | 1 | 1 | 1003 |
| 0 | 0 | 0 | 1 | 0 | 0 | 1004 |
| 0 | 0 | 1 | 0 | 0 | 0 | 1008 |
| 0 | 1 | 0 | 0 | 0 | 0 | 1016 |
| 1 | 0 | 0 | 0 | 0 | 0 | 1032 |
| 1 | 0 | 0 | 0 | 0 | 1 | 1033 |
| 1 | 0 | 0 | 0 | 1 | 0 | 1034 |
| 1 | 0 | 0 | 0 | 1 | 1 | 1035 |
| 1 | 1 | 1 | 1 | 0 | 0 | 1060 |
| 1 | 1 | 1 | 1 | 0 | 1 | 1061 |
| 1 | 1 | 1 | 1 | 1 | 0 | 1062 |
| 1 | 1 | 1 | 1 | 1 | 1 | 1063 |

Of the 8 elements employed in each of the iterative processor stages shown in FIG. 1, seven are standard microwave components, namely the RF switch 13, the mixer 14, the filter 15, the amplifier 16, the filter 20, the mixer 21 and the filter 22. The binary frequency divider 17 may be a parametric subharmonic oscillator phase locked to one/half the input frequency. These oscillators are described in the articles referenced in the description of the prior art set forth above. It is emphasized that the type of phase locking employed in these oscillators is performed without phase detectors and feedback loops as employed in the indirect method of frequency synthesis.

Figure 3:
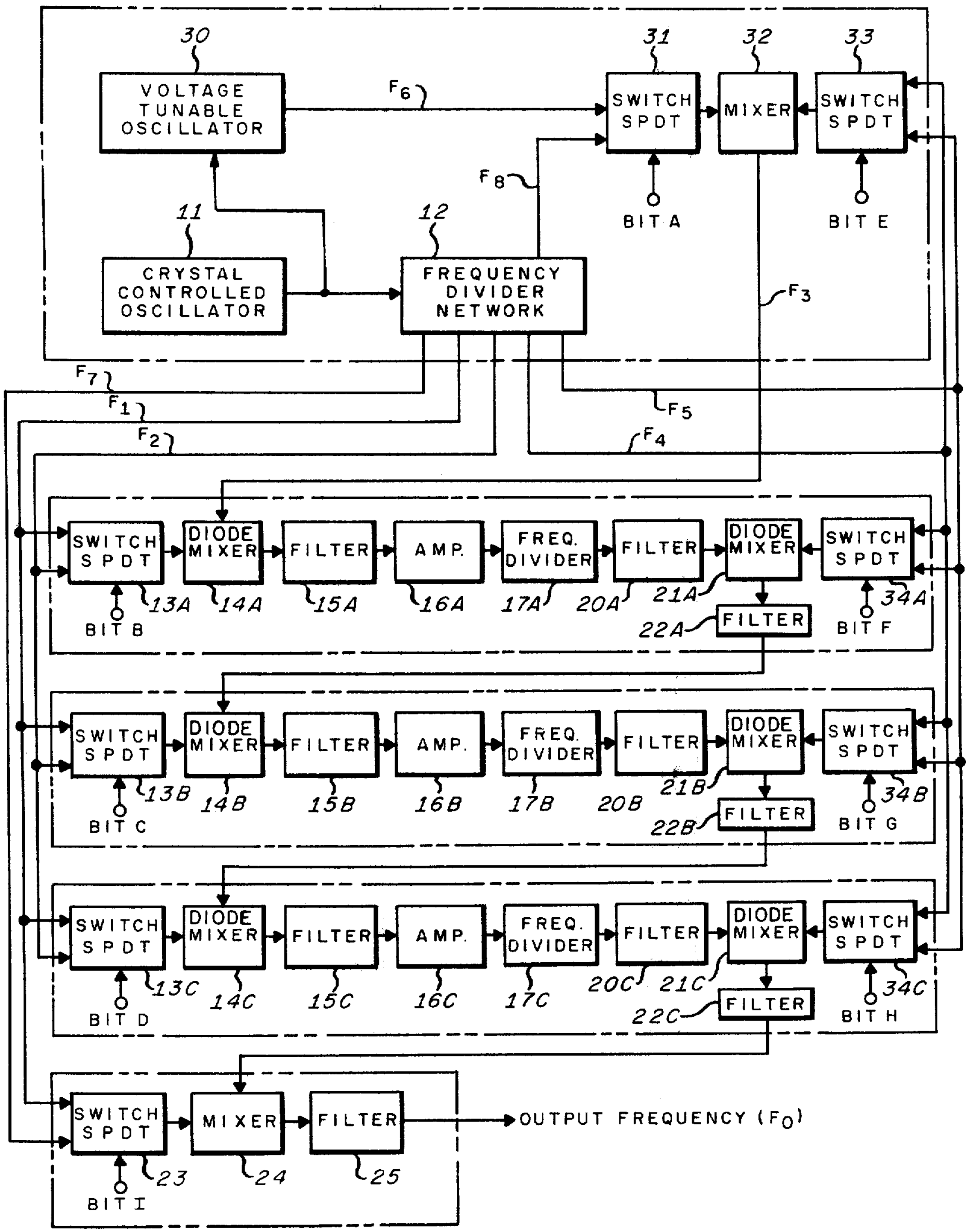
FIG. 3 is a block diagram of a frequency synthesizer incorporating an alternate embodiment of the invention.

An alternate embodiment of the subject invention is illustrated in FIG. 3 which is similar to the embodiment in FIG. 1 with the following differences: only three iterative stages are employed; each stage includes an additional single pole double throw RF switch 34; and the means for providing one of the synchronized internally generated frequencies includes a voltage tunable oscillator 30 synchronized to the output of the crystal controlled oscillator, a first single pole double throw RF switch 31, a mixer 32, and a second single pole double throw RF switch 33.

The first single pole double throw switch 31 selects either a fixed internally generated frequency $F_8$ from the frequency divider network 12 or a variable frequency $F_6$ from the voltage tunable oscillator 30 in response to the binary bit command signal, bit A. The second switch 33 selects either the frequency $F_4$ or the frequency $F_5$ from the frequency divider network 12 in response to the binary bit command signal, bit E. The frequency signals selected by the first and second switches 31 and 33 are coupled into first and second input terminals respectively on the mixer 32. The difference frequency output signal $F_3$ produced by the mixer 32 is different from the fixed internal frequency $F_3$ in the first embodiment because in this embodiment the frequency $F_3$ is a function of the frequencies $F_4$, $F_5$, $F_6$, and $F_8$ as selected by the binary bit command signals, bits A and E.

In addition, the frequency $F_5$ may be selectively coupled through switches 34A–C into the second input terminals on the corresponding mixers 21A–C which is distinct from the first embodiment wherein only frequency $F_4$ is coupled into the mixer 21 in each iterative stage.

The output stage of this embodiment is similar to the output stage in the first embodiment with the exception that the single pole double throw RF switch is coupled to the frequency divider network 12 to receive the fixed frequency $F_1$ and $F_7$ while binary bit command signal bit I instead of bit E selects either the frequency $F_1$ or $F_7$ to be coupled into the mixer 24.

The additional internal frequencies, $F_5$, $F_6$, $F_7$ and $F_8$, along with the additional switches 34A–C in each iterative processor stage allows a lesser number of stages to be used than is required in the first embodiment. Furthermore, this configuration substantially reduces the switching time delays in the synthesizer as compared to those required in the first embodiment while also reducing the volume of space required for the equipment and the cost thereof, as will be more fully explained below.

In this embodiment the voltage tunable oscillator 30 may produce a plurality of selectable discrete frequency output signals or may provide frequency modulation of the output frequency from the synthesizer.

The operation of the alternate embodiment will be explained with respect to FIG. 4 which is a simplified block diagram of the frequency synthesizer illustrated in FIG. 3. The filters 15A–C, 20A–C, 22A–C and 25, amplifiers 16A–C, the crystal contról oscillator 11 and the frequency divider network 12 have all been omitted from FIG. 4 in order to simplify the explanation and presentation of the alternate embodiment for specific values of frequency.

Figure 4:
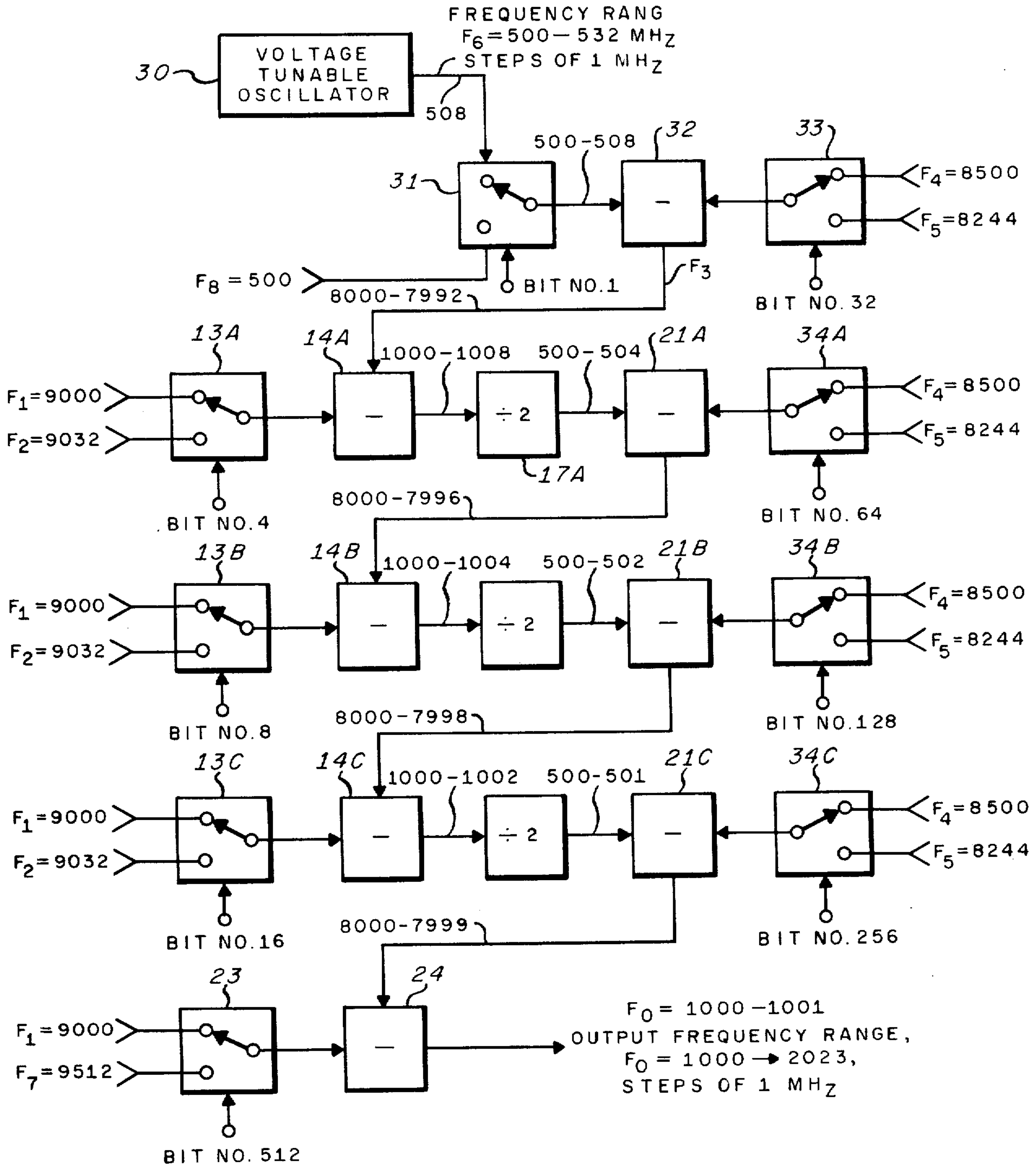
FIG. 4 is a simplified block diagram of the alternate embodiment of the invention including typical frequency values

To obtain a difference frequency output $F_0$ having a value of 1,000 MHz all the binary bit command signals, bit numbers 1, 4, 8, 16, 32, 64, 128, 256 and 512 are digital zeros and the switches 31, 33, 13A–C, 23 and 34A–C are in the positions shown in FIG. 4. In addition, all the frequency values shown are in megahertz (MHz).

The frequency, $F_8$, having a value of 500 is coupled through switch 31 to the first input terminal on the mixer 32 and frequency $F_4$ having a value of 8,500 is coupled through switch 33 into the second input terminal on the mixer 32. A difference frequency output signal, $F_3$, having a value of 8,000 is coupled into the second input terminal on the mixer 14A and the frequency $F_1$ having a value of 9,000 is coupled through the switch 13A into the first input terminal on the mixer 14A. A difference frequency output signal having a value of 1,000 is coupled through binary divider 17A where it is divided by one-half and the resulting divided frequency signal having a value of 500 is coupled to the first input terminal on the mixer 21A. The frequency $F_4$ having a value of 8,500 is coupled through the switch 34A to the second input terminal on the mixer 21A which produces a difference frequency output signal having a value of 8,000 that is coupled into the second input terminal on the mixer 14B. The foregoing process is repeated for the second and third iterative stages. The difference frequency output signal produced by the second mixer 21C in the third iterative stage has a value of 8,000 which is coupled into the second input terminal on the mixer 24. The frequency $F_1$ having a value of 9,000 is coupled through the switch 23 in the output stage to the first input terminal on the mixer 24 which produces the desired difference frequency output signal $F_O$ having a value of 1,000 MHz.

In order to change the difference output frequency signal, $F_O$, by 1 MHz the difference frequency from the output of the mixer 14A must have a value of 1,008 because there are only three binary dividers between the output of the mixer 14A and the output mixer 24.

The voltage tunable oscillator 30 may be an oscillator which produces selectable frequency output signals in a range of 500 to 532 MHz in 1 MHz steps. Therefore, in order to obtain the desired 1,001 MHz output frequency from the mixer 24A the selected frequency output $F_6$ from the voltage tunable oscillator 30 is set at 508 MHz and the binary bit command signal, bit A, is a digital 1. The selected frequency $F_6$ having a value of 508 MHz is coupled through the switch 31 to the first input terminal on the mixer 32. The frequency $F_4$ having a valve of 508 MHz is coupled through the switch 33 to the second input terminal on the mixer 32 which produces a difference frequency output signal $F_3$ having a value of 7992 that is coupled to the second input terminal on the first mixer 14A in the first stage. The frequency $F_1$ having a value of 9,000 is coupled through the switch 13A to the first input terminal on the mixer 14A which produces a difference frequency output having a value of 1,008 MHz which is the required frequency value to produce a difference frequency output signal, $F_O$, from the mixer 24 having a value of 1,000 MHz.

Therefore, to obtain difference frequency output signals from the synthesizer having values of 1,001, 1,002 and 1,003 binary bit A must be a digital 1 and the output frequency signal $F_6$ from the voltage tunable oscillator 30 must have the frequency values 508, 516 and 524 MHz respectively while the remaining binary bit command signals, bit numbers 4 through 512 are digital zeros. Furthermore the frequency $F_6$ will have the above mentioned values of frequency for all difference output frequencies, $F_O$ having values of 1, 2, 3, 5, 6 and 7.

It follows therefore when the binary bit command signals, bits A–I, are bit numbers 1, 4, 8, 16, 32, 64, 128, 256 and 512 respectively and control the selection of the frequencies $F_1$, $F_2$, $F_4$, $F_5$, $F_6$, $F_7$ and $F_8$ in the RF switches 13A–C, 23, 34A–C, 31 and 33 then 1,024 different frequency values are produced for the output frequency, $F_O$, in the range 1,000–2,023 MHz in steps of 1 MHz in accordance with Table II.

TABLE II

| BIT NUMBER | | | | | | | | | VTO | NUMBER |
|---|---|---|---|---|---|---|---|---|---|---|
| 512 | 256 | 128 | 64 | 32 | 16 | 8 | 4 | 1 | — | — |
| 0 | 0 | 0 | 0 | 0 | 0 | 0 | 0 | 0 | — | 1000 |
| 0 | 0 | 0 | 0 | 0 | 0 | 0 | 0 | 1 | 508 | 1001 |
| 0 | 0 | 0 | 0 | 0 | 0 | 0 | 0 | 1 | 516 | 1002 |
| 0 | 0 | 0 | 0 | 0 | 0 | 0 | 0 | 1 | 524 | 1003 |
| 0 | 0 | 0 | 0 | 0 | 0 | 0 | 1 | 0 | — | 1004 |
| 0 | 0 | 0 | 0 | 0 | 0 | 0 | 1 | 1 | 524 | 1007 |
| 0 | 0 | 0 | 0 | 0 | 0 | 1 | 0 | 0 | — | 1008 |
| 0 | 0 | 0 | 0 | 0 | 0 | 1 | 0 | 1 | 508 | 1009 |
| 0 | 0 | 0 | 0 | 0 | 0 | 1 | 1 | 1 | 524 | 1015 |
| 0 | 0 | 0 | 0 | 0 | 1 | 0 | 0 | 0 | — | 1016 |
| 0 | 0 | 0 | 0 | 0 | 1 | 0 | 0 | 1 | 508 | 1017 |
| 0 | 0 | 0 | 0 | 0 | 1 | 1 | 1 | 1 | 524 | 1031 |
| 0 | 0 | 0 | 0 | 1 | 0 | 0 | 0 | 0 | — | 1032 |
| 0 | 0 | 0 | 0 | 1 | 0 | 0 | 0 | 1 | 508 | 1033 |
| 0 | 0 | 0 | 0 | 1 | 1 | 1 | 1 | 1 | 524 | 1063 |
| 0 | 0 | 0 | 1 | 0 | 0 | 0 | 0 | 0 | — | 1064 |
| 0 | 0 | 0 | 1 | 0 | 0 | 0 | 0 | 1 | 508 | 1065 |
| 0 | 0 | 0 | 1 | 1 | 1 | 1 | 1 | 1 | 524 | 1127 |
| 0 | 0 | 1 | 0 | 0 | 0 | 0 | 0 | 0 | — | 1128 |
| 0 | 0 | 1 | 0 | 0 | 0 | 0 | 0 | 1 | 508 | 1129 |
| 0 | 0 | 1 | 1 | 1 | 1 | 1 | 1 | 1 | 524 | 1255 |
| 0 | 1 | 0 | 0 | 0 | 0 | 0 | 0 | 0 | — | 1256 |
| 0 | 1 | 0 | 0 | 0 | 0 | 0 | 0 | 1 | 508 | 1257 |
| 0 | 1 | 1 | 1 | 1 | 1 | 1 | 1 | 1 | 524 | 1511 |
| 1 | 0 | 0 | 0 | 0 | 0 | 0 | 0 | 0 | — | 1512 |
| 1 | 0 | 0 | 0 | 0 | 0 | 0 | 0 | 1 | 508 | 1513 |
| 1 | 1 | 1 | 1 | 1 | 1 | 1 | 1 | 1 | 524 | 2023 |

When the frequency $F_6$ from the voltage tunable oscillator 30 is changed in 1 MHz steps, this change is coupled through three frequency dividers, i.e., 17A, 17B and 17C, for a total division of 8. Thus for each 1 MHz change in frequency input to divider 17A a frequency change of 125 kHz is produced in the difference frequency output signal $F_O$ from the mixer 24. Additionally, any frequency errors in the ouput frequency from the voltage tunable oscillator 30 are also divided by 8 thereby being significantly reduced in the output frequency $F_O$.

When the binary bit command signal, bit A, coupled to the RF switch 31 is a digital 0 and $F_8$ has a value of 500 MHz coupled into the first input terminal on the mixer 32, the difference frequency output signal $F_O$ may be varied from 1,000 to 2,020 MHz in 4 MHz steps. Whereas when bit A is a digital 1 and the frequency $F_6$ is varied from 500 to 532 MHz in steps of 1 MHz the difference output frequency $F_O$ can be changed from 1,000 to 2,023 in steps of 125 kHz.

A comparison of FIGS. 2 and 4 shows that the operation of each iterative stage is identical in that each stage provides subtraction, division by 2 and subtraction as a frequency signal is conducted from left to right through each stage.

Furthermore, the alternate embodiment shown in FIGS. 3 and 4 provides a distinct advantage over the embodiment shown in FIGS. 1 and 2 with respect to switching time. Typically the elements employed in the iterative stages have the following respective time delays for providing difference frequency output signals, $F_O$, in the 1,000 MHz to 2,000 MHz band. The following times for each component are in nanoseconds: mixers 13A–E — 1.0; filters 14A–E — 2.5; amplifiers 15A–E — 1.2; frequency dividers 17A–E — 8.0; filters 20A–E — 5.0; mixers 21A–E — 2.0; and filters 22A–E — 2.5. Thus, the total time delay for each iterative stage is 22.2 nanoseconds and the total for the embodiment shown in FIG. 1 having five stages is 111.0 nanoseconds. The output stage has a time delay of 3.5 and in order to switch from one output frequency to another output frequency at least one switch time delay of 10.0 nanoseconds is required giving a total system time delay of 124.5 nanoseconds.

However, for the embodiment shown in FIG. 3 to provide the same frequency band in identical steps as that shown in FIG. 1 only one-half the number of iterative stages will be required. Therefore, only one-half the number of frequency dividers 17 and filters 20 will be required and since these account for the largest time delay, 8.0 and 5.0 nanoseconds respectively, in each stage, the alternate embodiment will provide a switching time approximately one-half that of the embodiment shown in FIG. 1.

Operation of the device at lower frequencies produces a concurrent increase in time delays because the filter bandwidths are decreased. For example, with reference to FIGS. 2 and 4, if the frequencies shown therein are divided by 10, the filter bandwidths are decreased with a multiple of 10 increase in time delay. The divider time delay will increase by a factor of 10 because the divider time delay and input frequency are related in the following manner. Assume an input frequency to the divider (where the division is equal to N) of a frequency F. The output frequency, $F_0$, is equal to F/N. If the input frequency changes to a new value of F', then one complete cycle of $F_0$ must occur to arrive at the new output of $F'_0$. The time required is simply the time for one cycle of output and is equal to $1/F_0$ and is the same as $1/NF_0$; hence, the divider time delay depends upon the input-frequency and the value of N. This delay will be a minimum for large values of input frequency and small values of N. In general, all parts of the system will have a time delay increased by a factor of 10 when all the frequencies are divided by a factor of 10. Hence, the total system time delay will increase by a factor of 10. Alternately, when the synthesizer is operated at higher frequencies, the time delay will decrease since larger bandwidths and higher divider frequencies are utilized.

The voltage tunable oscillator 30 as shown in FIGS. 3 and 4 cna be used to provide frequency modulation for both sweep frequency and discrete frequency steps by either frequency modulating or sweeping the output frequency from the synthesizer. Frequency errors inherent in the voltage tunable oscillator are additive to the total output frequency error except for being divided by the number of frequency divider stages between the voltage tunable oscillator 30 and the synthesizer output stage. For example, as shown in FIG. 4, three frequency dividers are disposed between the voltage tunable oscillator 30 and the output mixer 24 in the output stage. Thus any frequency errors in the voltage tunable oscillator 30 will be divided by 8. However, the percentage of error will not remain the same for different values of output frequency. If the frequency $F_6$ from the voltage tunable oscillator 30 was set for 500 MHz but was subject to drift by 0.5 MHz, this change due to drift at the ouput of the synthesizer shown in FIG. 4 would be 0.0625 MHz and represents a much smaller change (0.0625 MHz/1,000–2,023 MHz) than at the output of the voltage tunable oscillator 30 (0.5 MHz–500 MHz).

Although the embodiment shown in FIGS. 3 and 4 requires a greater number of internal frequencies than the embodiment shown in FIGS. 1 and 2, there are other advantages to be realized from employing the alternate embodiment. These advantages will be appreciated from the following example.

Assume a direct type binary frequency synthesizer is required that produces a frequency output having a range from 1,000 MHz to 2,020 MHz in steps of 4 MHz increments. The first embodiment employing seven iterative stages and an output stage will employ four frequency sources to generate each of the required internal frequencies, and three power dividers (two eight-way dividers and one seven-way power divider) to couple frequencies $F_1$, $F_2$, and $F_3$ into the respective RF switches. In addition, eight RF switches, mixers, first band pass filters and RF amplifiers will be required in addition to seven binary dividers, second bandpass filters, second mixers and third band pass filters. The time delay of each of the seven iterative stages is 157.5 nanoseconds and the time delay of the ouput stage is 4.7 nanoseconds for a total time delay of this configuration of 162.2 nanoseconds. In addition, the total volume occupied by these elements is 90 cubic inches having a total cost of $15,800.

The alternate embodiments require six frequency sources to generate the internal frequencies $F_1$, $F_2$, $F_4$, $F_5$, $F_7$ and $F_8$. There is no requirement in this example for a voltage tunable oscillator 30 to generate the frequency $F_6$. Four-way power dividers coupled to the frequency sources for the frequencies $F_1$, $F_2$, $F_4$ and $F_5$ are required to couple these frequencies into the eight associated RF switches. In addition, four first mixers, first band pass filters, RF amplifiers, second mixers and third band pass filters are utilized along with three frequency dividers and three second band pass filters.

The time delay in this embodiment is comprised of the input stage having a time delay of 4.5 nanoseconds, the three iterative stages having a time delay of 67.5 nanoseconds and the output stage having a time delay of 4.7 nanoseconds for a total time delay in this alternate embodiment of 76.7 nanoseconds. Thus, the second embodiment provides the same outputs as the first embodiment with a time delay less than one-half the total time delay of the system in the first embodiment and furthermore this configuration requires 5% less total volume and represents a 20% savings in cost.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. A direct-type frequency synthesizer comprising frequency generator means for providing at least four synchronized output frequency signals at four different frequencies, $F_1$, $F_2$, $F_3$ and $F_4$, digital bit command signal means having at least first and second output terminals for providing digital command signals, processor means having at least four input terminals coupled to corresponding output terminals on said frequency generator means and responsive to said frequencies $F_1$, $F_2$, $F_3$ and $F_4$ respectively, said processor means having a fifth input terminal coupled to said first output terminal on said digital bit command signal means and an output terminal for providing a first frequency output signal having a frequency value equal to $$F_4 - \frac{(F_2 - F_3)}{2}$$

and a second frequency output signal having a frequency value equal to $$F_1 - \frac{(F_1 - F_3)}{2},$$

and output difference circuit means having four input terminals, a first terminal coupled to said output terminal on said processor means, two terminals coupled to said frequency generator means for receiving two of said four frequency signals and a fourth terminal coupled to said second output terminal on said digital bit command signal means whereby said output circuit means provides discrete frequency output signals selectable in accordance with said digital command signals from a range of synthesizer output frequency signals having a maximum frequency equal to the difference between the frequencies of the higher frequency output signal from said processor means and the lower frequency output signal of said two of four frequency signals and having a minimum frequency equal to the difference between the frequencies of the lower frequency output signal from said processor means and the higher frequency output signal of said two of four frequency signals.

2. A direct-type frequency synthesizer as recited in claim 1 further including additional processor means having at least four input terminals wherein three of said input terminals are coupled to corresponding output terminals on said frequency source and responsive to output frequency signals at frequencies $F_1$, $F_2$ and $F_4$ respectively, a fourth input terminal is coupled to said output terminal on said first processor means, an output terminal coupled to said first terminal on said output difference circuit means and, said additional processor means having a fifth input terminal coupled to said first output terminal on said digital bit command signal means whereby said output circuit means provides discrete frequency output signals selectable in accordance with said digital command signals from an increased range of synthesizer output frequency signals having an increased number of increments within said increased range of frequencies.

3. A direct-type frequency synthesizer as recited in claim 1 in which said frequency generator means includes a crystal oscillator coupled to a divider network for providing said output frequency signals at frequencies $F_1$, $F_2$, $F_3$ and $F_4$.

4. A direct-type frequency synthesizer as recited in claim 1 in which said frequency generator means includes a plurality of synchronized oscillators for providing said frequency signals at frequencies $F_1$, $F_2$, $F_3$ and $F_4$.

5. A direct-type frequency synthesizer as recited in claim 4 in which said frequency generator means provides four output signals at frequencies of $F_1 = 9{,}000$ MHz, $F_2 = 9{,}032$ MHz, $F_3 = 8{,}000$ MHz and $F_4 = 8{,}500$ MHz, and five serially connected stages for providing discrete frequency output signal over the range from 1,000 through 1,063 MHz in increments of 1 MHz.

6. A direct-type frequency synthesizer as recited in claim 1 in which said processor means includes a series circuit comprised of switching means having first and second input terminals responsive to said first and second synchronized output frequency signals at frequencies $F_1$ and $F_2$ respectively, first difference frequency means having a first input terminal coupled to said switching means and a second input terminal coupled to said frequency generator means and responsive to said second synchronized output frequency signal at frequency $F_3$ for providing a first frequency output signal having a frequency value equal to $F_2$–$F_3$ and a second frequency output signal having a frequency value equal to $F_1$–$F_3$, binary divider means coupled to said first difference frequency means for providing a first output frequency signal having a frequency value equal to $$\frac{F_2 - F_3}{2}$$

and a second frequency output signal having a frequency value equal to $$\frac{F_1 - F_3}{2},$$

and a second difference frequency means having a first input terminal coupled to the output of said binary divider means and a second input terminal coupled to said frequency generator means and responsive to said fourth synchronized output frequency signal at frequency $F_4$ for providing said first frequency output signal having a frequency value equal to $$F_4 - \frac{(F_2 - F_3)}{2}$$

and a second frequency output signal having a frequency value equal to $$F_4 - \frac{(F_1 - F_3)}{2}.$$

7. A direct-type frequency synthesizer as recited in claim 6 in which said series circuit further includes first band pass filter means and amplifier means coupled between said first difference frequency means and said binary divider means, second band pass filter means coupled between said binary divider means and said second difference frequency means, and third band pass filter means coupled to said second difference frequency means for providing said first and second frequency output signals.

8. A direct-type frequency synthesizer as recited in claim 6 in which said first and second difference frequency means include passive diode mixers.

9. A direct-type frequency synthesizer as recited in claim 1 in which said output difference circuit means includes switching means for selecting one of said two of said four frequency signals.

10. A direct-type frequency synthesizer as recited in claim 1 in which said output difference circuit means includes a series circuit comprising switching means having two input terminals coupled to said frequency generator means for receiving first and second synchronized output frequency signals at frequencies $F_1$ and $F_2$ respectively and a third input terminal coupled to said digital bit command signal means for providing a first output signal of frequency $F_1$ and a second output signal of frequency $F_2$, difference frequency mixing means having a first input terminal coupled to said switching means and a second input terminal coupled to said output terminal on said processor means for providing a first output frequency signal having a frequency equal to the difference between said frequency signal $F_2$ and the frequency of the output frequency signal from said processor means and a second frequency output signal having a frequency value equal to the difference of said frequency signal $F_1$ and the frequency of said output frequency from said processor means, and band filter means having an input terminal coupled to the output of said difference mixing means for providing first and second filtered output signals.

11. A direct-type frequency synthesizer comprising frequency generator means for providing at least six synchronized output frequency signals at frequencies $F_1$, $F_2$, $F_3$, $F_4$, $F_5$ and one variable frequency $F_6$, digital bit command signal means having at least three output terminals for providing separate digital command signals, processor means having at least five input terminals coupled to corresponding output terminals on said frequency generator means and responsive to said frequencies $F_1$, $F_2$, $F_3$, $F_4$ and $F_6$ respectively, said processor means having sixth and seventh input terminals coupled to two of said three output terminals on said digital bit command signal means and an output terminal for providing a first frequency output signal having a frequency value equal to $$F_5 - \frac{(F_2 - F_6)}{2}$$

and a second frequency output signal having a frequency value equal to $$F_4 - \frac{(F_1 - F_6)}{2},$$

and output difference circuit means having four input terminals, a first terminal coupled to said output terminal on said processor means, two terminals coupled to said frequency generator means for receiving frequency signals $F_1$ and $F_3$ respectively and a fourth terminal coupled to said third terminal on said digital bit command signal means whereby said output circuit means provides discrete frequency output signals selectable in accordance with said digital command signals from a range of synthesizer output frequency signals having a maximum frequency equal to $$F_3 - \left[F_4 - \frac{(F_1 - F_6)}{2}\right]$$

and having a minimum frequency equal to $$F_1 - \left[F_5 - \frac{(F_2 - F_6)}{2}\right].$$

12. A direct-type frequency synthesizer as recited in claim 11 in which said frequency generator means includes a voltage tunable oscillator for providing said output frequency signal, $F_6$, having a variable frequency.

13. A direct-type frequency synthesizer as recited in claim 11 in which said frequency generator means includes a crystal controlled oscillator coupled to a frequency divider network for producing said output frequency signals at said five fixed frequencies $F_1$, $F_2$, $F_3$, $F_4$, and $F_5$.

* * * * *